(12) United States Patent
Stromberg

(10) Patent No.: US 6,552,916 B1
(45) Date of Patent: Apr. 22, 2003

(54) ELECTRICAL INTERFERENCE PROTECTION ARRANGEMENT FOR EMBEDDED CONTROL COMPUTERS

(76) Inventor: Jan-Erik Stromberg, Platens Vdg 70A, S-590 77 Vreta Kloster (SE)

( * ) Notice: Subject to any disclaimer, the term of this patent is extended or adjusted under 35 U.S.C. 154(b) by 0 days.

(21) Appl. No.: 09/700,766
(22) PCT Filed: May 10, 1999
(86) PCT No.: PCT/SE99/00781
§ 371 (c)(1),
(2), (4) Date: Nov. 20, 2000
(87) PCT Pub. No.: WO00/67358
PCT Pub. Date: Nov. 9, 2000

(30) Foreign Application Priority Data

May 20, 1998 (SE) .............................. 9801791

(51) Int. Cl.[7] .................................. H05K 9/00
(52) U.S. Cl. ...................... 361/816; 361/796; 361/800; 361/818; 174/35 R
(58) Field of Search ................................ 361/681, 796, 361/797, 800, 816, 818; 174/35 R

(56) References Cited

U.S. PATENT DOCUMENTS

| | | |
|---|---|---|
| 5,021,763 A | 6/1991 | Obear |
| 5,309,315 A | 5/1994 | Naedel et al. |
| 5,351,176 A * | 9/1994 | Smith et al. ................. 361/681 |
| 5,430,607 A | 7/1995 | Smith |
| 5,570,270 A | 10/1996 | Naedel et al. |
| 5,726,866 A * | 3/1998 | Allen ......................... 361/816 |
| 5,953,206 A * | 9/1999 | Jondrow ..................... 361/687 |

* cited by examiner

Primary Examiner—Jayprakash N. Gandhi
(74) Attorney, Agent, or Firm—Merchant & Gould, P.C.

(57) ABSTRACT

The present invention relates to an arrangement and methods for protection against electrical interference in a control computer (1) adapted to control at least one external unit (2). The invention in characterized in that the control computer (1) comprises hardware modules (4) designed to personal computer standards. In addition at least one of the modules (4) is operatively connected to means (8) adapted to prevent at least the interference which is harmful to the modules from reaching the latter and vice-versa. The interference-preventing means (8) are further operatively connected to the external unit (2). The arrangement comprises means adapted to shield the modules and the connection between the modules and the interference-preventing means in order to prevent capacitive/inductive transmission of the interference. The means of shielding comprise an outer casing (5), essentially enclosing at least the modules and the connection between the modules and the interference-preventing means and shielding them against electromagnetic radiation, together with an inner casing (9) essentially enclosing at least one of the modules and shielding it against electromagnetic radiation.

10 Claims, 2 Drawing Sheets

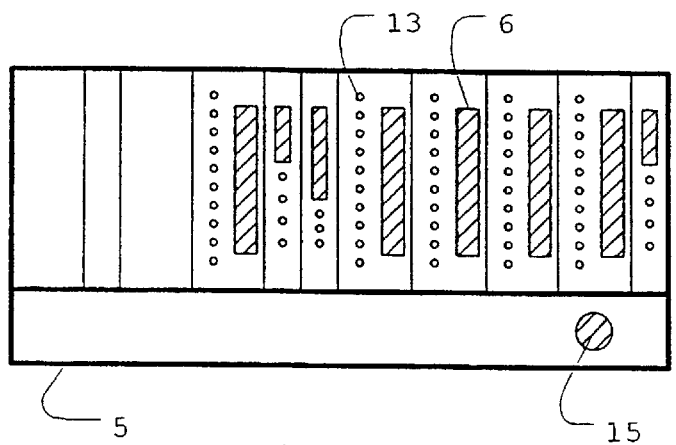
FIG 3
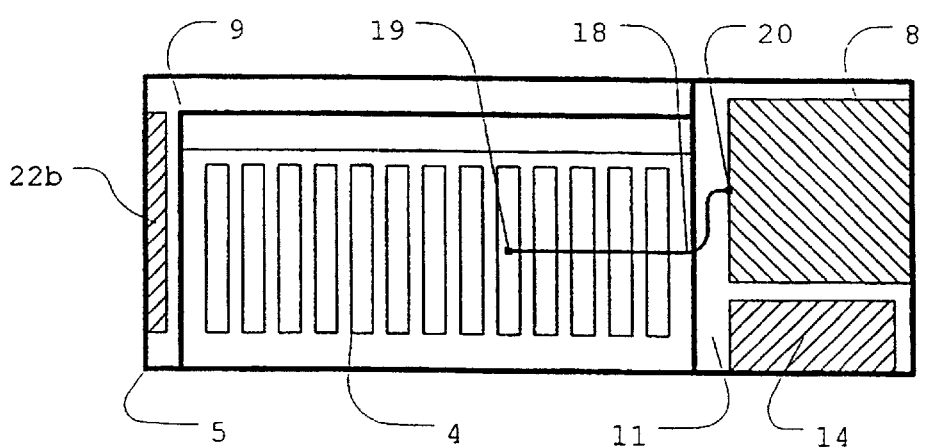
FIG 4
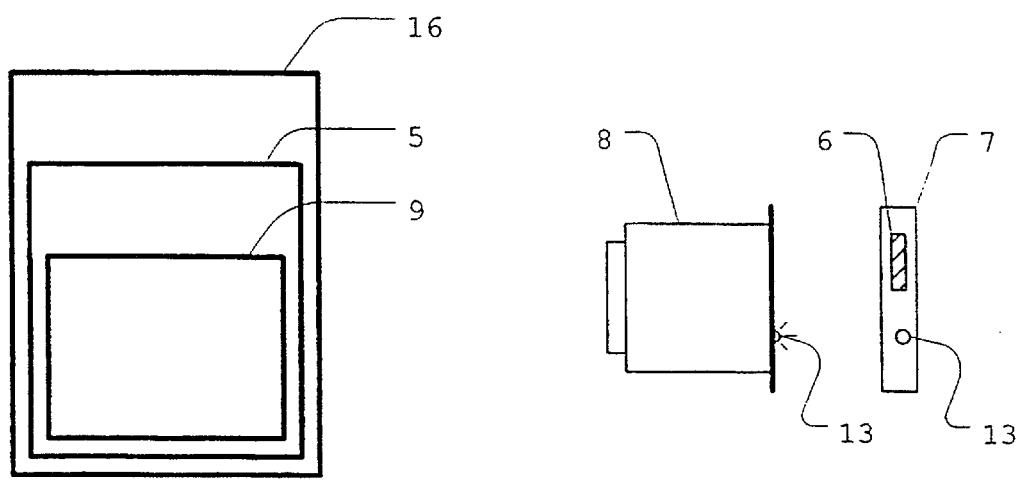
FIG 5
FIG 6

ELECTRICAL INTERFERENCE PROTECTION ARRANGEMENT FOR EMBEDDED CONTROL COMPUTERS

FIELD OF THE INVENTION

The present invention relates to an arrangement for protection against electrical interference in a control computer. The present invention also relates to a method for protecting hardware modules forming part of a control computer against electrical interference and a method of protection against electrical interference emitted by a control computer comprising hardware modules.

BACKGROUND OF THE INVENTION

Programmable industrial control systems have traditionally been made up from highly specialized hardware and software modules. In recent years, however, there has been increasing interest in also using the so-called personal computer or PC concept for industrial control and automation. This is due to the fact that the personal computer concept is associated with a number of advantages, such as modularity, flexibility, incomparable access to both software tools and hardware modules and high quality, together with well-developed standardization. Personal computers, however, are constructed on the basis of the requirements of an office environment and are therefore in many respects unsuitable for use in more exacting environmental conditions.

Firstly, contacts and other mechanical parts are often designed for an office environment and are not of sufficient mechanical and electrical quality for an industrial environment. Secondly, the mechanical and electrical design of hardware modules of personal computers is such that modules cannot be replaced during operation. This facility is extremely desirable in the case of industrial control in order to avoid having to shut down an entire production line in the event of a failure in a module. Furthermore the electrical design of hardware modules is often far too deficient for industrial use. The great majority of modules on the market lack basic electrical protection, which is always required in an industrial context in order to prevent the destructive or inconvenient effect of incident electromagnetic interference, whether line-conducted or transmitted through capacitance/inductance. Even if specially manufactured hardware modules are used with complete protection, the problem remains that interference is still given off in the vicinity of modules that do not have corresponding protection, which in turn leads to a risk of capacitive/inductive transmission of the interference. Furthermore the main components according to the PC concept are basically not designed to withstand the levels of interference that an industrial control system i s expected to withstand. By main components we mean here the CPU and the so-called PC bus for electrical communication between the CPU and the constituent hardware modules. The said hardware modules must therefore be protected from the risk of line-conducted or capacitive/inductive interference.

An hermetically sealed construction for use in difficult environmental conditions, especially in military environments, is described in U.S. Pat. No. 5,570,270. The construction comprises a personal computer and a casing containing printed circuit cards and is intended to protect the printed circuit cards from electromagnetic interference (EMI) and mechanical influences in the form of high accelerations.

SUMMARY OF THE INVENTION

The present invention is intended to produce an improved arrangement and methods compared to the prior art in a control computer for use, for example, in an industrial or medical environment, which provide a good compromise between good protection against interference on the one band and flexibility and interchangeability on the other.

This is made possible by an arrangement of the type stated in the introductory part, which is characterised in that the control computer comprises hardware modules designed to personal computer standards, in that at least one of the modules is connected by way of first leads to means adapted to prevent at least the line-conducted interference, which is harmful to the modules, from reaching the latter, in that the interference-preventing means are connected by way of second leads to the external unit and that the arrangement comprises means adapted to shield the modules and the connection between the modules and the interference-prevent means in order to prevent capacitive/inductive transmission of the interference, the said means of shielding comprising an outer casing, essentially enclosing at least the modules and the connection between the modules and the interference-preventing means and shielding them against electromagnetic radiation, together with an inner casing essentially enclosing at least one of the modules and shielding it against electromagnetic radiation.

This has also been made possible by means of methods of the type stated in the introductory part, which are characterised in that at least the signals from the external unit to each module are made to pass through interference-preventing means, which prevent the signal interference that is harmful to the modules from reaching the latter, that the control computer is essentially enclosed by an outer casing, shielding it against interference in the form of electromagnetic radiation, and that the hardware modules are essentially enclosed by an inner casing shielding them against the said electromagnetic interference, in which the parts of the control computer that are located inside the inner casing are designed in accordance with a personal computer standard and the parts of the control computer that are located outside the inner casing are designed in accordance with a standard for use in some industrial environment, for example DIN. The casings are adapted both to protect the modules from external electromagnetic radiation and to protect the surroundings from electromagnetic radiation that is emitted by the modules. In addition the signals from each module to the external unit can also be made to pass through the interference-preventing means, which prevent signal interference in excess of a certain energy level from passing.

The present invention has a number of improvements on the prior art. Among other things, shielding against electromagnetic radiation is produced in two stages, which function even in environments very susceptible to interference, for example hospital environments, where interference from and by equipment located in the vicinity is entirely unacceptable. In addition high energies are prevented from reaching the unshielded parts of the control computer by way of the leads. Furthermore the method and the arrangement according to the invention are, for example, suitable for use in the control and automation of various processes in industry. Valuable advantages in this and other contexts include the fact that the arrangement according to the invention can be manufactured at relatively low cost, due among other things to the use of standard components and the simplicity of the arrangement, and to the fact that it is possible to replace components during operation.

BRIEF DESCRIPTION OF THE DRAWINGS

The present invention will be described in more detail below in relation to examples of the embodiment and with reference to the attached figures, in which:

FIG. 3 shows a front view of the arrangement in FIG. 1.

FIG. 4 shows a side view of the arrangement in FIG. 1.

FIG. 5 shows an example of various energy levels in an arrangement according to the invention.

FIG. 6 shows an example of a signal adjusting circuit.

DETAILED DESCRIPTION OF THE PREFERRED EMBODIMENT(S)

Figure 1:
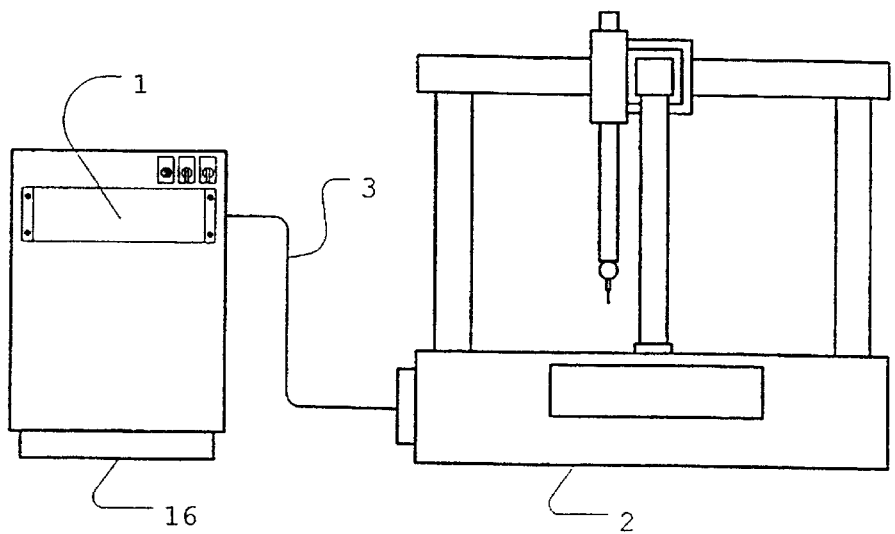
FIG. 1 shows a control computer and a robot, which the control computer is adapted to control.

In FIG. 1 a control computer is indicated by reference number 1, the control computer 1 being adapted to control an external unit 2 in the form, for example, of a robot. Of course, it is also possible to conceive of an embodiment with control of a plurality of external units (not shown). In addition the control computer is located in a control cabinet 16. Leads 3 are run between the control computer 1 and the robot 2 for transmitting signals between these units. As will be discussed in more detail later, the control computer comprises an internal unit, which contains personal computer components, that is components based on standards according to IBM PC concept and/or pc-104 standard or the like.

Figure 2:
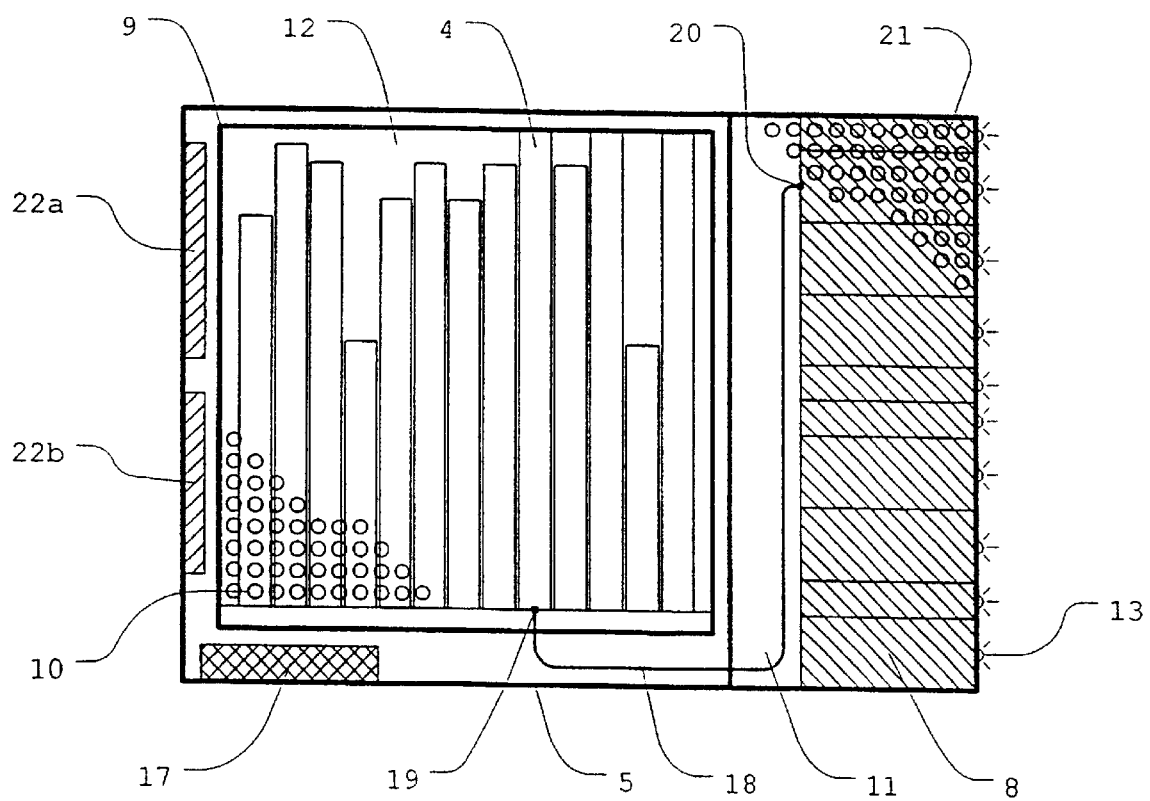
FIG. 2 shows an example of an arrangement in the control computer according to the present invention viewed from above.

The arrangement shown in FIGS. 2, 3 and 4 is adapted to protect the components forming part of the internal unit against electrical interference, which can damage or be destructive of the said components, and in the same way to eliminate, or at least considerably reduce interference emitted from the components in the internal unit. The components referred to in this description are the hardware modules of which a personal computer is made up, such as the computer mother board, possibly comprising the CPU, memory cards, graphics cards and interfaces to external units in the form of sensors and actuators. In FIG. 2 reference number 4 denotes one of the plug-in cards inserted into the internal unit, in the form, for example, of an IBM-compatible plug-in card for the ISA bus. The space for the internal unit is denoted in FIG. 2 by the reference number 12.

The plug-in card inserted in the space 12 is operatively connected to the external unit 2. The leads 3 from the external unit 2 lead to a casing 5 enclosing a control computer 1 by way of mechanically robust connection contacts 6, which are arranged to receive signals with high energy levels and which are shown in FIG. 3. The contacts 6 are designed in accordance with any industrial standard for contacts formulated for the operating environment contemplated, for example DIN 41652, IEC 807, MIL-C-5015. In one example the casing 5 is designed in accordance with DIN 41494 and IEC 297 for enclosures of standard width (19 inches ~0.48 m) and in the most advantageous case has a height of four height units (1 height unit ~40.4 mm). The contacts 6 are in turn connected to signal-adjusting circuits 8, which are adapted to prevent signals with amplitudes or energy levels that interfere with or damage the hardware modules of the internal unit or circuits arranged thereon from reaching the latter and in the same way to prevent the emission of line-conducted interference.

The signal adjusting circuits may be of conventional type and contain an amplitude limiter and possibly also a frequency limiter (band-pass filter). The said signal-adjusting circuits 8 are also designed in accordance with any industrial standard formulated for the operating environment contemplated (for example, DIN 41494+IEC 297). From the signal-adjusting circuits 8 the signals are relayed to leads 18 by way of contacts 20 designed according to any industrial standard for contacts, for example DIN 41612. In one embodiment the leads 18 are run to the hardware modules by way of connections 19 conforming to personal computer standards.

The entire arrangement with the hardware modules 4 of the internal unit, the signal-adjusting circuits 8 and the leads 18 is enclosed in the casing 5, which is shielded from electromagnetic radiation and is thus adapted to function as a Faraday cage. Since components conforming to personal computer standards are more susceptible to electrical interference than those conforming to industrial standards, the hardware modules 4 should be additionally protected against interference. For this reason these modules are also enclosed in an inner casing 9 shielding them from electromagnetic radiation, this casing also being adapted to function as a Faraday cage. As can be seen from FIG. 2, the inner casing 9, like the outer casing 5, has ventilation openings 10 and 21 respectively. Ventilation openings are preferably located both in the base and the top of the casings 5, 9 in order to dissipate heat generated by the hardware modules. Through the ventilation holes 10, 21, designed so as to maximise the heat radiation, air is allowed to flow through the arrangement so that heat generated in the hardware modules is removed from the arrangement by natural convection. This avoids or considerably reduces the need for fan arrangements and filters which otherwise often create problems in industrial environments.

The shielding construction described above produces a space 11 inside the outer casing 5 that is largely shielded from radiation. In addition the inner casing 9 provides shielding from the radiation from the components contained in the space 12, so that very little, if any of the said radiation reaches the space 11. The casing 5 therefore ensures that the signal-adjusting circuits 8 are not exposed to large doses of electromagnetic radiation. In addition the leads 18, the signals of which have been adjusted for the energy levels that the hardware modules can withstand, are to a large extent protected against external radiation and against radiation from the components in the space 12. The inner casing 9, as stated previously, provides both an additional protection against external radiation for the components contained in the space 12 and a protection for the components in the space 11 against radiation from the components in the space 12. In most industrial environments the energy level in the space 12 will be less than that in the space 11. If, however, the control computer is used for any medical application and is located in a hospital environment with stringent emitted radiation requirements, the energy level in the space 12 will be higher than that in the space 11. Thus the design with two levels of shielding provides protection both against line-conducted interference reaching the susceptible modules 4 and vice versa, and against interference transmitted through capacitance/inductance reaching the said modules and vice-versa.

The signal-adjusting circuits 8 are arranged adjacent to the outer casing 5, accessible for replacement in the even of a fault in the said circuits, for example by being able to remove one side 7 of the outer casing. Faults can occur, for example, if signal energies reach the circuits, the energy levels of which the circuits are not adapted to withstand. The signal-adjusting circuits are of modular construction and in the event of a fault in any of the said circuits can be replaced. In order to facilitate fault localisation, indicators 13, in the form of light-emitting diodes, for example, can be connected to each signal-adjusting circuit in order to indicate whether current is flowing through this or not. In an advantageous embodiment the signal-adjusting circuits 8 are designed so that they can be replaced during operation. The electrical characteristics of the circuits 8 are such that removal of a circuit 8 for changing does not result in any signal levels harmful to the associated module reaching that module. FIG. 6 shows an example of a signal-adjusting circuit 8, an indicator 13. which shows the signal level in the circuit, a part 7 of the casing 5 and a contact connection 6.

There are also, as can be seen from FIG. 4, spaces for a power supply unit 14, mass storage unit 17 and user interface 22a, 22b and other emitters of electromagnetic radiation in the space 11. The power supply unit 14 is there to supply voltage to the signal-adjusting circuits, the hardware modules and other units that require a power supply. The power supply unit is fed with alternating current voltage or direct current voltage via a connection 15 provided for the purpose and shown in FIG. 3. The power supply unit preferably also contains some form of amplitude and frequency limiter for the reduction of interference irradiated and emitted via leads.

A method of protecting hardware modules forming part of a control computer against electrical interference comprises the following stages. At least one of the modules is operatively connected to an external unit so that electrical signals can be transmitted between each module and the external unit. Signals from the external unit to each module and vice-versa are made to pass through interference-preventing means. The said means prevent signal interference that is harmful to the modules from reaching the latter and vice-versa in the opposite direction. The control computer is essentially enclosed by an outer casing shielding it against interference in the form of electromagnetic radiation. The hardware modules are essentially enclosed by an inner casing shielding them from the said electromagnetic interference. The parts of the control computer that are located inside the inner casing are designed in accordance with a personal computer standard and the parts of the control computer that are located outside the inner casing are designed in accordance with a standard for use in some industrial environment, for example DIN. The casings protect both the modules from external electromagnetic radiation and the surroundings of the control computer from electromagnetic radiation that is emitted from the modules.

As will be apparent from the above, the present invention does not relate solely to protection against radiated energy. In the case of medical equipment, for example, it is quite important to prevent radiation from the hardware modules of the personal computer from reaching the surroundings. The arrangement and method according to the invention also relate to protection against such emitted radiation. The arrangement and method according to the invention have been shown to meet EC standards according to medical requirements, for example EN 601-1-2.

In one example the arrangement according to the invention is constructed so that four different energy levels are produced, as can be seen from FIG. 5. The environment in which the control computer was intended to be installed outside a control cabinet 16 has an energy level 0. The walls, base and top of the control cabinet may produce energy damping, the energy level in the control cabinet 16 being lower than that outside the control cabinet; here we call the energy level in the control cabinet energy level 1. As stated previously, the outer casing 5 provides additional shielding, the energy level inside the casing being lower still; here called energy level 2. The components enclosed by the outer casing 5 are designed, for example, in accordance with a DIN standard. The inner casing 9 creates further shielding, a further energy level, called energy level 3, prevailing inside the inner casing 9. Inside the inner casing the components are designed in accordance with a personal computer standard.

What is claimed is:

1. Arrangement for protection against electrical interference in a control computer controlling at least one external unit, wherein the control computer comprises hardware modules designed to personal computer standards, and at least one of the modules is connected by at least one first lead to at least one means for preventing at least line-conducted interference which is harmful to the modules from reaching the modules, wherein the means for preventing at least line-conducted interference includes a signal adjusting circuit; at least one second lead connecting the means for preventing to the external unit; and the arrangement further comprises means for shielding the modules and the first lead in order to prevent capacitive/inductive transmission of interference, said means for shielding comprising an outer casing enclosing at least the modules and the first lead for shielding the modules and the first lead against electromagnetic radiation, and an inner casing enclosing at least one of the modules and shielding the module against electromagnetic radiation.

2. Arrangement according to claim 1, wherein the means for preventing is adapted to prevent the transmission of line-conducted interference in excess of a predetermined energy level by way of the second lead between the means for preventing and the external unit in the direction of the external unit.

3. Arrangement according to claim 1, wherein the means for preventing is arranged adjacent to the outer casing.

4. Arrangement according to claim 2, wherein the means for preventing is of modular construction and has means to facilitate fault localization.

5. Arrangement according to claim 1, wherein parts of the control computer that are located inside the inner casing are designed in accordance with the personal computer standard, and parts of the control computer that are located outside the inner casing are designed to comply with a standard for use in an industrial environment.

6. Arrangement according to claim 1, wherein the means for preventing comprises amplitude and frequency-limiting circuits.

7. Method of protecting hardware modules forming part of a control computer against electrical interference, the method comprising:

operatively connecting at least one of the modules to an external unit so that electrical signals can be transmitted between each module and the external unit;

passing the signals from the external unit to each module through interference-preventing means which prevent signal interference that is harmful to the modules from reaching the modules, the interference preventing means including a signal adjusting circuit;

enclosing the control computer in an outer casing to shield the control computer against interference in the form of electromagnetic radiation;

enclosing the hardware modules in an inner casing to shield the modules from electromagnetic interference;

designing the parts of the control computer that are located inside the inner casing in accordance with a personal computer standard and designing the parts of the control computer that are located outside the inner casing in accordance with a standard for use in an industrial environment.

8. Method according to claim 7, wherein the interference-preventing means prevent interference by limiting the signal amplitudes and/or the frequency interval of the signals.

9. Method of protecting against electrical interference emitted from a control computer that includes hardware modules, the method comprising:

operatively connecting at least one of the modules to an external unit so that electrical signals can be transmitted between each module and the external unit;

passing the signals from each module to the external unit through interference-preventing means which prevent signal interference in excess of a predetermined energy level from passing, the interference preventing means including a signal adjusting circuit;

enclosing the control computer in an outer casing to shield the control computer against interference in the form of electromagnetic radiation emitted from the modulus;

enclosing the hardware modules in an inner casing to shield the modules from electromagnetic interference:

designing the parts of the control computer that are located inside the inner casing in accordance with a personal computer standard and designing the parts of the control computer that are located outside the inner casing in accordance with a standard for use in an industrial environment.

10. Method according to claim 9, wherein the interference-preventing means prevent interference by limiting the signal amplitudes and/or the frequency interval of the signals.

* * * * *